(12) United States Patent
Losehand

(10) Patent No.: US 7,508,192 B2
(45) Date of Patent: Mar. 24, 2009

(54) CIRCUIT WITH A CAPACITIVE ELEMENT WITH METHOD FOR TESTING THE SAME

(75) Inventor: Reinhard Losehand, Munich (DE)

(73) Assignee: Infineon Technologies AG, Munich (DE)

( * ) Notice: Subject to any disclaimer, the term of this patent is extended or adjusted under 35 U.S.C. 154(b) by 263 days.

(21) Appl. No.: 11/505,631

(22) Filed: Aug. 17, 2006

(65) Prior Publication Data

US 2007/0041145 A1    Feb. 22, 2007

(30) Foreign Application Priority Data

Aug. 17, 2005   (DE)   ................ 10 2005 038 895

(51) Int. Cl.
*G01R 31/26*   (2006.01)
(52) U.S. Cl. .................. 324/158.1; 324/765; 324/768
(58) Field of Classification Search .............. None
See application file for complete search history.

(56) References Cited

U.S. PATENT DOCUMENTS 5,621,310 A  *  4/1997  Cosgrove et al. .............. 324/74
5,726,605 A     3/1998  Morse et al.
6,259,268 B1    7/2001  Crozier et al.
2004/0012044 A1  1/2004  Hoshi

FOREIGN PATENT DOCUMENTS

| DE | 19904608 A1 | 9/2000 |
| JP | 4207050 | 7/1992 |
| WO | WO 00/17664 | 3/2000 |

* cited by examiner

*Primary Examiner*—Minh N Tang
(74) *Attorney, Agent, or Firm*—Maginot, Moore & Beck

(57) ABSTRACT

A circuit has an input terminal, an output terminal, a supply voltage terminal, a ground terminal and a useful circuit, wherein the useful circuit has a capacitive element with a first and a second capacitance terminal, wherein the capacitive element has a series connection of two series capacitors, which are connected to each other at an inner capacitance node, and an additional testing terminal coupled to the inner capacitance node, and designed such that at least one of the series capacitors is positioned between the additional testing terminal and the reference terminal comprising the input terminal, the output terminal, the supply voltage terminal and the ground terminal, related to current flow.

19 Claims, 1 Drawing Sheet

CIRCUIT WITH A CAPACITIVE ELEMENT WITH METHOD FOR TESTING THE SAME

CROSS-REFERENCE TO RELATED APPLICATION

This application claims priority from German Patent Application No. 102005038895.7, which was filed on Aug. 17, 2005 and is incorporated herein by reference in its entirety.

BACKGROUND OF THE INVENTION

1. FIELD OF THE INVENTION

The present invention relates to a circuit with a capacitive element and a method for testing the same.

2. DESCRIPTION OF THE RELATED ART

ICs (IC=integrated circuit) are increasingly required to integrate electronic devices, which are at present mounted outside the integrated circuit on a board. This leads to a reduction of the space requirements for a circuit, which is to perform a predetermined functionality. Thereby, increasingly, capacitors are integrated, for example, in silicon high-frequency ICs. Thus, the number of required devices in a high-frequency circuit or high-frequency system, respectively, can be reduced.

Normally, the capacitors integrated in the silicon high-frequency IC or chip, respectively, are designed such that they have a higher breakdown voltage than the semiconductors or resistor devices used in the integrated circuit.

However, the capacitors integrated in the chip can often not be provided with voltages as high as their breakdown voltage when testing the device. Thus, it is harder or impossible to detect defective capacitors. Those defective capacitors can represent a reliability risk for an operation of the integrated circuit.

This reliability risk causes a limitation of the overall size of used capacitors in an integrated circuit to a value, where a probability of a failure of one of the used capacitors remains low. This has the effect that larger capacitors are frequently mounted at the external terminals or outside the integrated circuit on a circuit board, respectively, as discrete capacitors, and are connected with those integrated circuits via their external terminals. Thus, due to the external capacitors, which are to be provided on the printed circuit board, increased space requirements result on a printed circuit board for a circuit with predetermined functionality.

SUMMARY OF THE INVENTION

It would be advantageous to provide a circuit with a capacitive element, which has improved reliability, and to provide a method for testing the circuit having improved reliability.

In accordance with a first aspect, the present invention in at least one embodiment provides a circuit having an input terminal into the circuit for feeding in a useful signal to be processed by the circuit, an output terminal out of the circuit for outputting a useful signal processed by the circuit, a useful circuit connected between the input terminal and the output terminal and designed to process the useful signal, a supply voltage terminal for supplying a supply voltage to the useful circuit, a ground terminal connected to the useful circuit, wherein the useful circuit has a capacitive element with a first and a second capacitance terminal, wherein the capacitive element has a series connection of two series capacitors, which are connected to each other at an inner capacitance node, wherein the first or the second capacitance terminal is coupled to a reference terminal comprising the input terminal, the output terminal, the supply voltage terminal or the ground terminal, such that direct current or alternating current with a frequency where the series capacitors have a resistance of more than 500 Ω can flow, and an additional testing terminal, which is coupled to the inner capacitance node, and which is formed such that at least one of the series capacitors is positioned between the testing terminal and the reference terminal related to current flow.

In accordance with a second aspect, the present invention in at least one embodiment provides a method for testing a circuit, wherein the circuit has an input terminal into the circuit for feeding in a useful signal to be processed by the circuit, an output terminal out of the circuit for outputting a useful signal processed by the circuit, a useful circuit connected between the input terminal and the output terminal and designed to process the useful signal, a supply voltage terminal for supplying a supply voltage to the useful circuit, a ground terminal connected to the useful circuit, wherein the useful circuit has a capacitive element with a first and a second capacitance terminal, wherein the capacitive element has a series connection of two series capacitors, which are connected to each other at an inner capacitance node, and the first or the second capacitance terminal is coupled to a reference terminal comprising the input terminal, the output terminal, the supply voltage terminal or the ground terminal, such that direct current or alternating current with a frequency where the series capacitors have a resistance of more than 500 Ω can flow, and an additional testing terminal, which is coupled to the inner capacitance node, and which is designed such that at least one of the series capacitors is positioned between the testing terminal and the reference terminal, related to current flow, having the steps of applying a potential difference between the reference terminal and the additional testing terminal and determining a test result based on current flowing into the circuit at the additional testing terminal due to applying the potential difference.

The present invention is based on the knowledge that a capacitive element in a circuit can be designed in the form of a series connection of two capacitors, so that an inner capacitance node, where the two series capacitors are connected to each other, can be connected to a testing terminal. A terminal at one of the two series capacitors, which is not directly connected to the inner capacitance node, can then be coupled to a reference terminal, which comprises, for example, an input terminal, an output terminal, a supply voltage terminal or a ground terminal, so that when testing the series capacitors, voltage can be applied directly to one of the two series capacitors, which can also be higher than a voltage strength of a further device in the circuit.

Thus, a series capacitor can be tested with a higher voltage or a higher breakdown voltage, respectively, than another, for example non-capacitive device in the circuit.

By testing a series capacitor with a higher breakdown voltage, weaknesses in the breakdown strength of the series capacitor can be detected at an early stage. This can have the effect that chips, on which the implemented series capacitors show weaknesses of a breakdown strength during testing, are no longer delivered, or only used in devices where lower quality is required from the chips. Thus, the reliability of the series capacitor and thus the capacitive element, which comprises the series capacitor, is increased due to the improved tested breakdown strength.

The increased reliability of the series capacitors has the effect that more capacitors can be integrated in a chip, since the series capacitors now represent a significantly lower reliability risk for perfect operation of the circuit implemented on the chip. This allows a reduction of space requirements for a circuit having predetermined functionality, since now more capacitors can be integrated in one chip. Thus, reduced space requirements of a circuit according to an embodiment of the present invention offer, for example, a more flexible application in portable devices.

Additionally, capacitors or series capacitors, respectively, with higher capacitance and thus larger areas can be integrated on a chip, since a reliability risk of the capacitors with larger areas is reduced due to improved testing of the breakdown strength of the series capacitors.

Additionally, an improved protection results for the other devices in an integrated circuit, where the series capacitors with increased breakdown strength are used, since the series capacitors can now be connected directly to two terminals in a circuit according to an embodiment of the present invention between which a potential difference is applied for testing the series capacitors.

Then, in the circuit according to an embodiment of the present invention, the voltage for testing the breakdown strength of the series capacitors no longer drops at the other devices having lower breakdown strength. Thus, a probability that the other devices with lower breakdown strength are destroyed when testing the series capacitors by the higher voltages for testing the series capacitors is reduced.

Even a disadvantageous increase of the reliability risk due to arranging a capacitive element in the form of the two series capacitors, which causes an increase of the capacitance values implemented on the chip, is compensated by an increased reliability of the series capacitors to the improved testing of the series capacitors.

Specifically, this means, for example, that for implementing a capacitive element with a value of 1 nF, two series capacitors are arranged in a series connection, each with a value of 2 nF. Here, a probability that one of the two capacitors with a capacitance value of 2 nF has a weakness with regard to its breakdown strength is higher than in a chip with only one capacitor with a value of 1 nF. However, the inner capacitance node where the two series capacitors with the value of 2 nF are connected can be connected directly to a testing terminal, so that a voltage for testing the breakdown strength can be applied directly to the series capacitors. Since the inner node can be connected directly to the external additional testing terminal, higher voltages can be applied to the testing terminal and thus to the series capacitors with a value of 2 nF, than to the capacitor with a capacitance value of 1 nF. Thus, the reliability of the capacitive element consisting of the two series capacitors of each 2 nF is higher than in the capacitive element, which has only one capacitor of 1 nF, due to the improved testing of the breakdown strength with increased voltage.

BRIEF DESCRIPTION OF THE DRAWINGS

These and other advantages and features of the present invention will become clear from the following description taken in conjunction with the accompanying drawings, in which.

DESCRIPTION

Figure 1:
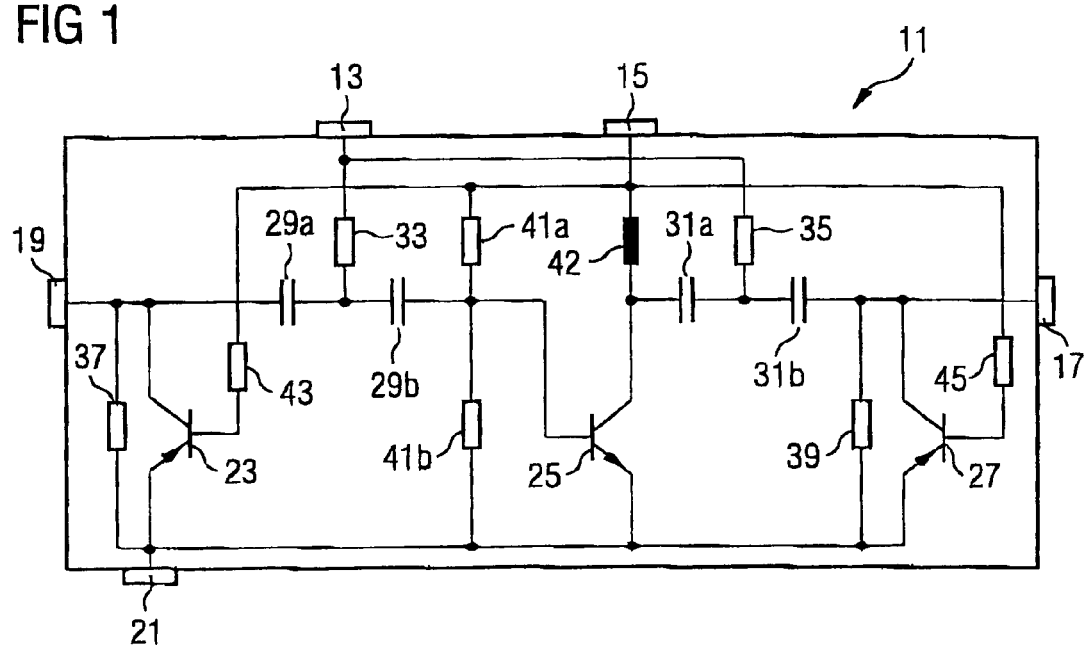
FIG. 1 is a high-frequency circuit according to one embodiment of the present invention.

FIG. 1 shows a high-frequency circuit 11 according to an embodiment of the present invention. The high-frequency circuit 11 or circuit, respectively, has a testing terminal 13, a supply voltage terminal 15, an output terminal 17, an input terminal 19 and a ground terminal 21. Further, the high-frequency circuit 11 comprises a first ESD protective transistor 23 (ESD=electrostatic discharge), an amplifying transistor 25 and a second ESD protective transistor 27. Above that, the high-frequency circuit has a first series capacitor 29a, a second series capacitor 29b, a third series capacitor 31a and a fourth series capacitor 31b. Additionally, a first testing terminal resistor 33, a second testing terminal resistor 35, an input resistor 37, an output resistor 39, a first bias resistor 41a, a second bias resistor 41b, a bias inductance 42, a first adjustable resistor 43 as well as a second adjustable resistor 45 are disposed in the high-frequency circuit 11.

The input terminal 19 is connected to the ground terminal 21 via the input resistor 37 and connected to a collector terminal of the first ESD protective transistor 23 and a first terminal of the first series capacitor 29a. A second terminal of the first series capacitor 29a is connected to a first terminal of the second series capacitor 29b and connected to the testing terminal 13 via the first testing terminal resistor 33. A second terminal of the second series capacitor 29b is connected to the supply voltage terminal 15 via the first bias resistor 41a, and connected to the ground terminal 21 via the second bias resistor 41b and connected to a base terminal of the amplifying transistor 25.

A collector terminal of the amplifying transistor 25 is coupled to the supply voltage terminal 15 via the bias inductance 42, and connected to a first terminal of the third series capacitor 31a. A second terminal of the third series capacitor 31a is connected to a first terminal of the fourth series capacitor 31b and connected to the testing terminal 13 via the second testing terminal resistor 35. A second terminal of the fourth series capacitor 31b is connected to the ground terminal 21 via the output resistor 39 and connected to the output terminal 17 and a collector terminal of the second ESD protective transistor 27.

The supply voltage terminal 15 is connected in an electrically conductive way to a base terminal of the first ESD protective transistor 23 via the first adjustable resistor 43, and to a base terminal of the second ESD protective transistor 27 via the second adjustable resistor 45. An emitter terminal of the first ESD protective transistor 23, an emitter terminal of the amplifying transistor 25 and an emitter terminal of the second ESD protective transistor 25 are each connected to the ground terminal 21 in an electrically conductive way.

The first ESD protective transistor 23 and the second ESD protective transistor 27 are each operated in reverse direction, which means a voltage in reverse direction is applied to the pn junction from the emitter terminal to the base terminal. When applying a positive voltage pulse, for example due to an ESD discharge pulse, to the collector terminals of the first or second ESD protective transistor 23, 27 across the input terminal 19 or the output terminal 17, so many holes are generated in the collector regions of the ESD protective transistors, that the same cause a high current to the ground terminal 21 and thus a breakdown of the ESD overvoltage pulse. An operating point of the amplifying transistor 25 is adjusted via the first bias resistor 31a and the second bias resistor 31b. The bias inductance 32 serves to filter out the high-frequency alternating signal portions and to stabilize thus the operating point adjustment and the amplification of the amplifying transistor 25.

The first series capacitor 29a and the second series capacitor 29b form a first coupling element or a first coupling capacitor, respectively, which is connected between the input terminal 19 and the base terminal of the amplifying transistor 25. The first coupling element serves to filter out the direct current portions or direct signal portions, respectively, so that only alternating current can flow between the input terminal 19 and the base terminal of the amplifying transistor 25. A series circuit of the third series capacitor 31a and the fourth series capacitor 31b forms a second coupling element or a second coupling capacitance, respectively, which again serves to filter out the direct signal portions or the direct current portions, respectively, so that only alternating current can flow between the output terminal 17 and the collector terminal of the amplifying transistor 25.

When testing the high-frequency circuit 11, a high voltage or a high potential difference, respectively, can be applied between the testing terminal 13 and the input terminal 19, to test the breakdown strength of the first series capacitor 29a. The other circuit elements apart from the first testing terminal resistor 33 and the series capacitor 29a are thereby connected such that no voltage drop or only a low voltage drop occurs at the same. Thus, the other circuit elements are protected against the high voltage applied at the testing terminal 13 during testing and are thus not destroyed during testing.

Applying a high potential difference between the testing terminal 13 and the supply voltage terminal 15 as well as the ground terminal 21 can test a breakdown strength of the second series capacitor 29b. Thereby, the supply voltage terminal 15 and the ground terminal 21 are may suitably be on the same potential, so that current from the testing terminal 13 drains off via the first testing terminal resistor 33, the second series capacitor 29b and a parallel connection of the first bias resistor 41a and the second bias resistor 41b. At the other circuit elements, no high voltage drop occurs when testing the second series capacitor 29b, so that the same are appropriately protected.

For testing the third series capacitor 31a, the potential difference is applied between the testing terminal 13 and the supply voltage terminal 15. When testing the third series capacitor 31a, a current flows via the second testing terminal resistor 35, the third series capacitor 31a and the bias inductance 42 to the supply voltage terminal 15. No current flow occurs at the other circuit elements, and thus no high voltage drop occurs at the same. Thus, the same are protected against the high potential difference applied for testing the breakdown strength of the third series capacitor 31a.

For testing the breakdown strength of the first series capacitor 31b, a high potential difference is applied between the testing terminal 13 and the output terminal 17. The current flowing in the process flows from the testing terminal 13 across the second testing terminal resistor 35 and the fourth series capacitor 31b to the output terminal 17. Thus, when testing the fourth series capacitor 31b, no current flows across the other devices in the high-frequency circuit 11 and the same are protected against the effects of the high potential difference applied between the testing terminal 13 and the output terminal.

The first testing terminal resistor 33 and the second testing terminal resistor 35 serve to decouple the second terminal of the first series capacitor 29a and the second terminal of the series capacitor 31a, or the inner capacitance node of the first coupling element and the inner capacitance node of the second coupling element, respectively, during normal operation of the device where no potential is applied to the testing terminal 13. In other words, the first testing terminal resistor 33 and the second testing terminal resistor 35 are chosen such that a potential at the second terminal of the first series capacitor 29 does not or only slightly influence a potential at the second terminal of the third series capacitor 31a during normal operation of the high-frequency circuit.

In the following, testing the series capacitors 29a, 29b, 31a, 31b will be discussed, where the series capacitors 29a, 29b, 31a, 31b are not tested offset in time to each other. For testing the high-frequency circuit shown in FIG. 1, a high potential is applied to the testing terminal 13, and a low potential or a circuit ground, respectively, is applied to the supply voltage terminal 15, the output terminal 17, the input terminal 19 and the ground terminal 21. Thereby, current flowing into the high-frequency circuit at the testing terminal 13 during testing is detected, and a test result is determined with regard to the current detected in that way. From the test result, conclusions can be drawn about the breakdown strength of the series capacitors 29a, 29b, 31a, 31b and thus about the quality of the high-frequency circuit 11.

When the current at the testing terminal 13 exceeds a predetermined value, the high-frequency circuit 11 can be discarded, or when different quality classes have been formed, the high-frequency circuit 11 where the current at the testing terminal exceeds a predetermined value, can for example, be sold only in a lower or poorer quality class, respectively. The high-frequency circuits in a lower quality class can then, for example, be used in devices where lower requirements or quality requirements, respectively, are made to the breakdown strength of the series capacitors or the coupling elements, respectively.

In the embodiment of the present invention shown in FIG. 1, every capacitive element or every coupling element is embodied as a series connection of two capacitors, which means a series connection of the first series capacitor 29a and the second series capacitor 29b, as well as a series connection of the third series capacitor 21a and the fourth series capacitor 31b. However, alternatively, only one of the two coupling elements can be embodied by two series capacitors. Alternatively, in the circuit according to an embodiment of the present invention, an arbitrary number of coupling elements or capacitive elements, respectively, can be disposed in the high-frequency circuit, which can then be embodied as a series connection of two or more series capacitors.

In the above embodiment of the present invention, the high-frequency circuit may suitably be designed to process a useful signal with a frequency in a range of more than 500 MHz. However, any circuits, as well as circuits that can be used in the low-frequency range, are alternatives. In the above embodiment of the present invention, the whole circuit may suitably be disposed on a chip, however, arbitrary arrangements of the devices of the circuit or the series capacitors, respectively, for example on a circuit board or on several chips, are alternatives, as long as two series capacitors are coupled to a testing terminal at a common terminal. In the above embodiment, the two intermediate contacts between the capacitor pairs or the two series capacitors connected in series, respectively, may suitably be galvanically separated from the rest of the circuit. The other circuit nodes, which means, for example, the first terminal of the first series capacitor and the second terminal of the second series capacitor are galvanically connected or conductively connected, respectively, to the inputs or supply voltage terminals, respectively. However, the first terminal of the first series capacitor and the second terminal of the second series capacitor could also be connected to one of the inputs or the supply voltage terminal, respectively, via a resistor, which can, for example, be designed in a high-impedance way.

In the above embodiment of the present invention, the intermediate contacts between the capacitor pairs, which means the terminals, where the series capacitors are connected to each other, are connected to the testing contact via the testing terminal resistors. Thereby, the value of the testing terminal resistors is higher than, for example, 500 Ω and may suitably be higher than 10 kΩ, in order to not affect a function of the circuit during normal operation, which means when no potential is applied to the testing input.

In the above embodiment of the present invention, a test voltage is applied to the testing terminal 13 or test contact, respectively, while all other terminals, such as the output terminal 17, the input terminal 19, the ground terminal 21 and the supply voltage terminal 15 are connected to 0 Volt, so that all series capacitors may suitably be loaded with the same voltage. By evaluating a current-voltage characteristic curve of current at the testing terminal 13, it can be determined whether a defect series capacitor exists in the circuit.

However, alternatively, the voltage between the testing terminal and the supply terminal, the ground terminal and the input terminal and the output terminal could be adjusted such that only at one of the series capacitors an increased voltage is applied for testing during a certain time period, so that in dependence on the detected current value, it can be determined which of the series capacitors in the circuit is defect.

In the above embodiment of the present invention, an electric strength or breakdown strength, respectively, of the series capacitors 29a, 29b, 31a, 31b is suitably higher than an electric strength of all other devices of the high-frequency circuit. However, alternatively, the electric strength of the series capacitors could only be higher than an electric strength of another device in the high-frequency circuit or a certain number of the other devices in the high-frequency circuit.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A circuit comprising:
   an input terminal configured to feed an input signal into the circuit;
   an output terminal configured to output a signal processed by the circuit;
   a processing circuit connected between the input terminal and the output terminal and configured to process the input signal;
   a supply voltage terminal configured to supply a supply voltage to the circuit;
   a ground terminal connected to the circuit;
   wherein the processing circuit comprises a capacitive element with a first and a second capacitance terminal, wherein the capacitive element comprises a series connection of two series capacitors which are connected to each other at an inner capacitance node;
   wherein the first or the second capacitance terminal is coupled to a reference terminal, the reference terminal comprising the input terminal, the output terminal, the supply voltage terminal or the ground terminal, such that direct current or alternating current flows, provided that the alternating current has a frequency such that the series capacitors have an impedance of more than 500 Ω; and
   a testing terminal coupled to the inner capacitance node, wherein at least one of the two series capacitors is positioned between the testing terminal and the reference terminal.

2. The circuit according to claim 1 comprising a further capacitive element comprising a third and a fourth capacitance terminal, wherein the further capacitive element comprises a series connection of two further series capacitors which are connected to each other at a further inner capacitance node, wherein the third or the fourth capacitance terminal is coupled to the reference terminal, and wherein the testing terminal is coupled to the further inner capacitance node and configured such that at least one of the further series capacitors is positioned between the testing terminal and the reference terminal related to current flow.

3. The circuit according to claim 2, wherein a testing terminal resistor is disposed between the testing terminal and the inner capacitance node, the testing terminal resistor having a resistance of more than 500 Ω, and wherein a further testing terminal resistor is disposed between the testing terminal and the further inner capacitance node, the further testing terminal having a resistance of more than 500 Ω.

4. The circuit according to claim 1, wherein the capacitive element is a coupling element, the coupling element connected between the input terminal and an inner terminal of the circuit or connected between the output terminal of the circuit and an inner terminal of the circuit.

5. The circuit according to claim 1, wherein the processing circuit comprises an amplifier circuit, and wherein the capacitive element is a coupling element having terminals that are not connected to the ground terminal.

6. The circuit according to claim 1, wherein the input terminal, the output terminal, the processing circuit, the supply voltage terminal, the testing terminal, the ground terminal and the capacitive element are disposed on a chip.

7. The circuit according to claim 1, wherein a predefined electric strength of one of the two series capacitors is higher than a predefined electric strength of a device of the processing circuit differing from the capacitive element.

8. The circuit according to claim 7, wherein the predefined electric strength of one of the two series capacitors is more than 1.5 times higher than the predefined electric strength of the device of the processing circuit.

9. The circuit according to claim 1, wherein the input signal is in a frequency range of more than 500 MHz.

10. The circuit according to claim 1, wherein the processing circuit comprises devices having an electric strength which is lower than the lower value of the electric strengths of the two series capacitors are not positioned between the reference terminal and the testing terminal.

11. A method for testing, the method comprising:
    providing a circuit comprising an input terminal configured to provide an input signal into the circuit,
    an output terminal configured to output an output signal processed by the circuit,
    a processing circuit connected between the input terminal and the output terminal and designed to process the input signal,
    a supply voltage terminal configured to provide a supply voltage to the processing circuit,
    a ground terminal connected to the processing circuit,
    wherein the processing circuit comprises a capacitive element with a first and a second capacitance terminal, wherein the capacitive element comprises a series connection of two series capacitors which are connected to each other at an inner capacitance node, wherein the first or the second capacitance terminal is coupled to a reference terminal comprising the input terminal, the output terminal, the supply voltage terminal or the ground terminal, such that direct current or alternating current flows, and a testing terminal coupled to the inner capacitance node, the testing terminal configured such that at least one of the series capacitors is positioned between the testing terminal and the reference terminal;

applying a potential difference between the reference terminal and the testing terminal; and determining a test result based on current flowing into the circuit at the testing terminal due to applying the potential difference.

12. The method of claim 11 wherein the circuit is configured such that the alternating current flows provided that the alternating current has a frequency such that the series capacitors have an impedance of more than 500 Ω.

13. The method of claim 11 wherein the reference terminal comprises the input terminal, the output terminal, the supply voltage terminal and the ground terminal, wherein the input terminal, the output terminal, the supply voltage terminal and the ground terminal are each provided with the same potential.

14. A circuit comprising:

an input terminal configured to receive an input signal;

an output terminal configured to provide an output signal;

a capacitive element connected between the input terminal and the output terminal, the capacitive element including a first capacitance terminal, a second capacitance terminal, a first series capacitor and a second series capacitor, wherein the first series capacitor is connected to the second series capacitor at an inner capacitance node, wherein the first capacitance terminal or the second capacitance terminal is coupled to a reference terminal, the reference terminal comprising the input terminal, the output terminal, a supply voltage terminal or a ground terminal, and wherein the coupling between the reference terminal and the first capacitance terminal or the second capacitance terminal is such that direct current or alternating current flows to the reference terminal; and a testing terminal coupled to the inner capacitance node, wherein at least one of the first series capacitor or second series capacitor is positioned between the testing terminal and the reference terminal.

15. The circuit of claim 14 wherein the alternating current has a frequency such that the first series capacitor and second series capacitor have an impedance of more than 500 Ω.

16. The circuit of claim 14 further comprising a further capacitive element comprising a third and a fourth capacitance terminal, wherein the further capacitive element comprises a series connection of two further series capacitors connected to each other at a further inner capacitance node, wherein the third or the fourth capacitance terminal is coupled to the reference terminal, and wherein the testing terminal is coupled to the further inner capacitance node, and wherein at least one of the further series capacitors is positioned between the testing terminal and the reference terminal.

17. The circuit of claim 14 further comprising an amplifier circuit, and wherein the capacitive element is a coupling element having terminals that are not connected to the ground terminal.

18. The circuit of claim 14 wherein the input terminal, the output terminal, the capacitive element, the supply voltage terminal, the testing terminal, and the ground terminal are provided on a chip.

19. The circuit of claim 14 wherein the input terminal is configured to receive an input signal in a frequency range of more than 500 MHz.

* * * * *